United States Patent
Loeppert (10) Patent No.: US 11,463,817 B2
(45) Date of Patent: Oct. 4, 2022

(54) CAPACITIVE MICROPHONE WITH SHAPED ELECTRODE

(71) Applicant: Knowles Electronics, LLC, Itasca, IL (US)

(72) Inventor: Peter V. Loeppert, Durand, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 7 days.

(21) Appl. No.: 17/217,601

(22) Filed: Mar. 30, 2021

(65) Prior Publication Data

US 2021/0337317 A1    Oct. 28, 2021

Related U.S. Application Data

(60) Provisional application No. 63/016,135, filed on Apr. 27, 2020.

(51) Int. Cl.

| H04R 19/00 | (2006.01) |
|---|---|
| H04R 19/04 | (2006.01) |
| H04R 7/04 | (2006.01) |
| H04R 1/04 | (2006.01) |
| H04R 3/00 | (2006.01) |
| B81B 3/00 | (2006.01) |

(52) U.S. Cl.
CPC ............ *H04R 19/04* (2013.01); *B81B 3/001* (2013.01); *B81B 3/0021* (2013.01); *H04R 1/04* (2013.01); *H04R 3/00* (2013.01); *H04R 7/04* (2013.01); *B81B 2201/0257* (2013.01); *B81B 2203/0127* (2013.01); *B81B 2203/04* (2013.01); *B81B 2207/012* (2013.01); *H04R 2201/003* (2013.01)

(58) Field of Classification Search
CPC . H04R 19/04; H04R 1/04; H04R 3/00; H04R 7/04; H04R 2201/003; H04R 19/005; B81B 3/001; B81B 3/0021; B81B 2201/0257; B81B 2203/0127; B81B 2203/04; B81B 2207/012; B81B 2203/053

See application file for complete search history.

(56) References Cited

U.S. PATENT DOCUMENTS

| 6,151,967 A | 11/2000 | McIntosh et al. |
| 10,710,868 B2 | 7/2020 | Jiang et al. |

(Continued)

FOREIGN PATENT DOCUMENTS

CN    108419193 A    8/2018

OTHER PUBLICATIONS

Shah, Muhammad Ali et al., "Design Approaches of MEMS Microphones for Enhanced Performance," Journal of Sensors, vol. 19, Article ID: 9294528, Published: Mar. 6, 2019.

*Primary Examiner* — Matthew A Eason
(74) *Attorney, Agent, or Firm* — Flener IP & Business Law; Zareefa B. Flener (57) ABSTRACT

A microelectromechanical systems (MEMS) die includes a substrate, a back plate, and a diaphragm. The back plate is coupled to the substrate and includes a dielectric layer and an electrode. The electrode is coupled to the dielectric layer and defines an opening that exposes a central portion of the dielectric layer. The diaphragm is oriented parallel to the back plate and is spaced apart from the back plate. In one implementation, a diameter of the opening is greater than or equal to ⅒ of the diameter of the diaphragm.

20 Claims, 8 Drawing Sheets

(56) References Cited

U.S. PATENT DOCUMENTS

| | | | |
|---|---|---|---|
| 2011/0075875 A1* | 3/2011 | Wu | B81C 1/0023 |
| | | | 381/361 |
| 2012/0056282 A1 | 3/2012 | Van Lippen et al. | |
| 2019/0215615 A1 | 7/2019 | Zhang et al. | |
| 2020/0186940 A1 | 6/2020 | Sun et al. | |
| 2020/0290864 A1* | 9/2020 | Fueldner | H04R 19/005 |

* cited by examiner

| Case | BP Electrode | $V_{collapse}$ (V) | Max Deflection (μm) | Capacitance (pF) | Sensitivity (dBV/Pa) |
|---|---|---|---|---|---|
| 1 | 0-300μm / 30V | 35 | 0.845 | 0.728 | -31.88 |
| 2 | 50-300μm / 30V | 37 | 0.739 | 0.699 | -32.59 |
| 3 | 100-300μm / 30V | 40 | 0.552 | 0.620 | -34.07 |
| 4 | 100-300μm / 33V | 40 | 0.720 | 0.642 | -32.00 |
| 5 | 100-300μm / 34V | 40 | 0.788 | 0.652 | -31.18 |
| 6 | 100-300μm / 35V | 40 | 0.864 | 0.663 | -30.25 |

CAPACITIVE MICROPHONE WITH SHAPED ELECTRODE

BACKGROUND

Microphones are deployed in various types of devices such as personal computers, cellular phones, mobile devices, headsets, headphones, and hearing aid devices. However, as these devices get smaller, so does the maximum allowable space for the microphone. Smaller microphones suffer from higher acoustic noise caused by air flow and thermal losses within the device and often have lower signal-to-noise ratios than larger microphones.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

In the following detailed description, various embodiments are described with reference to the appended drawings. The skilled person will understand that the accompanying drawings are schematic and simplified for clarity and therefore merely show details which are essential to the understanding of the disclosure, while other details have been left out. Like reference numerals refer to like elements or components throughout. Like elements or components will therefore not necessarily be described in detail with respect to each figure.

DETAILED DESCRIPTION

Capacitive microphone assemblies include a stationary back plate and a movable diaphragm, which moves relative to the back plate in response to acoustic energy (e.g., pressure fluctuations). The back plate and the diaphragm each include an electrode, which are used to convert the acoustic energy into an electrical signal that can be interpreted by the microphone assembly. The performance of the microphone assembly is determined, in part, based on the size of the electrode and the alignment between the electrode and the diaphragm and/or back plate. A reference related to the design of the back plate and/or diaphragm electrodes is provided by Voorthuyzen et al. (hereafter "Voorthuyzen"), "Optimization of Capacitive Microphone and Pressure Sensor Performance by Capacitor-electrode Shaping," Sensors and Actuators A, 331-336, 1991, which is incorporated by reference herein. In particular, Voorthuyzen describes how the size and position of the electrode can impact microphone performance. Voorthuyzen states: "for maximum sensitivity the electrode should be located at the cent[er] of the diaphragm, with a radius depending on the value of the amplifier input capacitance." Stated generally, Voorthuyzen teaches that it is desirable to (i) reduce the diameter of the electrode to a value that is less than the diameter of the diaphragm; and (ii) to position the electrode on a central region of the diaphragm, in a region of the diaphragm that experiences the greatest amount of deflection, to optimize the sensitivity and the SNR of the microphone assembly.

In general, disclosed herein are systems and methods for further improving the signal to noise ratio (SNR) of capacitive microphone assemblies. In particular, disclosed herein are systems and methods for improving SNR by selectively positioning the electrode on only certain portions of the back plate and/or diaphragm. As opposed to conventional wisdom, such as in Voorthuyzen, which teaches positioning the electrode near a location where the diaphragm experiences the greatest amount of deflection (e.g., the center of the diaphragm, farthest from a location at which the diaphragm is supported, etc.), the systems and methods disclosed herein involve positioning the electrode away from the region of maximum diaphragm deflection. This new way of positioning the electrode reduces the maximum amount of deflection that is experienced by the diaphragm, without significantly impacting the sensitivity of the microphone assembly. The details of the general depiction provided above will be more fully explained by reference to FIGS. 1-8.

Figure 1:
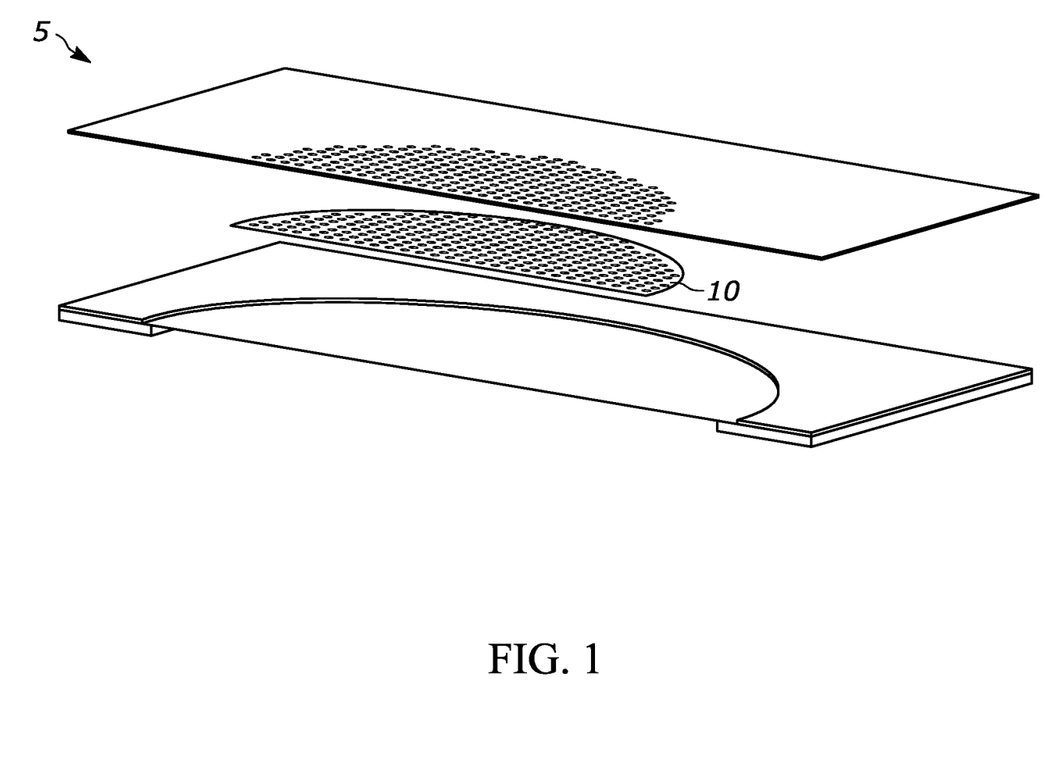
FIG. 1 is a partially exploded view of an example microelectromechanical systems (MEMS) die.
Figure 2:
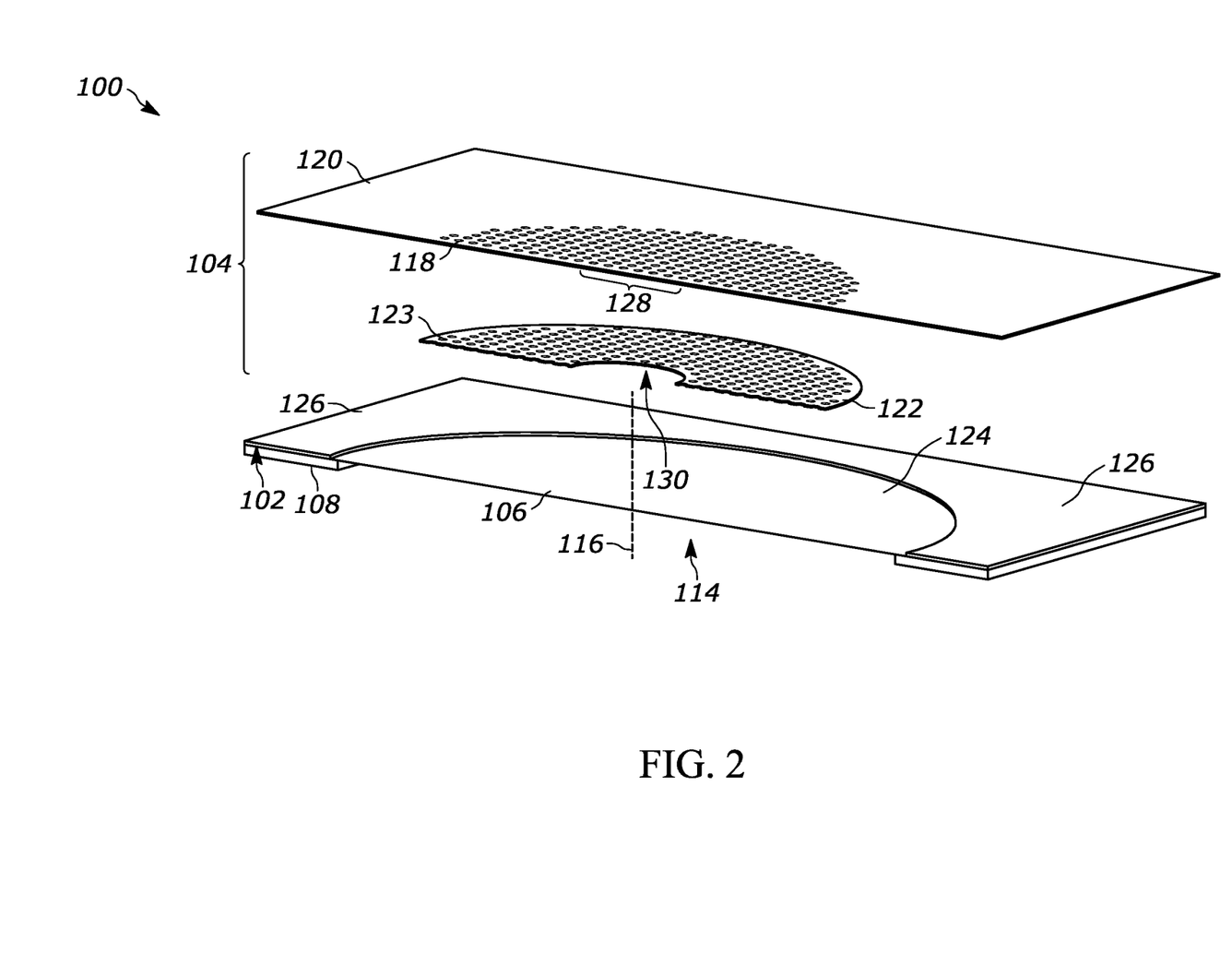
FIG. 2 is a partially exploded view of an example modified MEMS die.

As shown in FIGS. 1-2, one implementation relates to a MEMS die for a microphone assembly. In one embodiment, the MEMS die is a capacitive acoustic transducer structured to generate an electrical signal in response to acoustic disturbances incident on the transducer. In particular, FIGS. 1-2 show how the geometry of the MEMS die 100 of the present disclosure (FIG. 2) differs from other MEMS die structures (e.g., MEMS die 5 with electrodes 10 as shown in FIG. 1). As shown in FIG. 2, the MEMS die 100 of the present disclosure includes a substrate 102, a back plate 104, and a movable diaphragm 106. The substrate 102 includes a support wall 108 including a first end (e.g., upper end as shown in FIG. 2) and a second end (e.g., lower end) opposite the first end. The support wall 108 defines a cylindrical aperture 114 disposed centrally through the support wall 108 that extends in a substantially parallel orientation relative to a central axis 116 of the support wall 108 between the first end to the second end. The aperture 114 is configured to carry (e.g., transmit, etc.) sound energy to other parts of the MEMS die 100, such as the diaphragm 106.

The substrate 102 is coupled to and supports the back plate 104 and the diaphragm 106. In the embodiment of FIG. 2, the diaphragm 106 is deposited directly onto the first end of the support wall 108 at a periphery (e.g., outer perimeter, etc.) of the support wall 108. The back plate 104 is coupled to an upper side 124 of the diaphragm 106 by support layer 126 and is spaced apart from the diaphragm 106 by the support layer 126. In another embodiment, the back plate 104 is directly coupled to the support wall 108 at an outer perimeter of the support wall 108, or otherwise suspended proximate to the diaphragm 106.

As shown in FIG. 2, the back plate 104 defines a plurality of perforations 118 (e.g., small circular openings) extending through the back plate 104 in a direction normal to the back plate 104 (e.g., in a direction that is substantially parallel to the central axis 116 of the support wall 108). Each one of the perforations 118 is configured to allow air to pass through the back plate 104, from a first side of the back plate 104 (e.g., upper side as shown in FIG. 2) to a second side of the back plate 104 (e.g., lower side) facing the diaphragm 106.

As shown in FIG. 2, the diaphragm 106 is oriented parallel to the back plate 104 and is offset (e.g., spaced apart, etc.) from the back plate 104. The diaphragm 106 extends over the aperture 114, such that the diaphragm 106 covers the aperture 114. In the embodiment of FIG. 2, the back plate 104 is separated from the aperture 114 by the diaphragm 106. In another embodiment, the position of the diaphragm 106 and the back plate 104 may be reversed (e.g., the back plate 104 may be coupled to the first end of the support wall 108, and separate the diaphragm 106 from the aperture 114, etc.).

As shown in FIG. 2, the back plate 104 includes an insulating layer, shown as dielectric layer 120 and a conductive layer, shown as electrode 122 that is deposited onto or otherwise connected to the dielectric layer 120. The diaphragm 106 also includes a conductive layer (e.g., a second electrode). In one implementation, as shown in FIG. 2, the diaphragm 106 is made entirely from the conductive layer. In other embodiments, the diaphragm 106 may include both an insulating layer and a conductive layer, similar to the back plate 104. In yet another implementation, the diaphragm 106 may include both a conductive layer and an insulating layer, and the back plate 104 may be formed entirely from a conductive layer. As shown in FIG. 2, the conductive layers may be facing one another without any materials therebetween. In another embodiment, the conductive layers may be separated from one another by an insulating layer of the diaphragm 106 and/or back plate 104. For example, the electrode 122 may be disposed on a side of the back plate 104 opposite the diaphragm 106 (e.g., an upper side of the back plate 104 as shown in FIG. 2). The insulating layers of the back plate 104 and the diaphragm 106 may be made from silicon nitride or another suitable insulating material. The conductive layers on the back plate 104 and/or the diaphragm 106 may be made from a polycrystalline silicon, a metal, or another suitable conductor.

As shown in FIG. 2, the electrode 122 is a cylindrical disk that is deposited onto or otherwise connected to the back plate 104. In other implementations, the electrode 122 may be at least partially embedded into the back plate 104. The electrode 122 includes perforations 123 (e.g., small circular openings) extending through the electrode 122 in a direction that is substantially parallel to the central axis 116. As shown in FIG. 2, the perforations 123 extending through the electrode 122 are aligned with the perforations 118 extending through the back plate 104. As such, the pattern of and spacing between the perforations 123 in the electrode 122 are the same as the perforations 118 in the back plate 104.

Sound energy (e.g., sound waves, acoustic disturbances, etc.) incident on the diaphragm 106 causes the diaphragm 106 to move toward or away from the back plate 104. This results in a change in the distance between the electrode 122 and the diaphragm 106 (e.g., the second electrode). This change in the distance between the electrodes results in a corresponding change in capacitance. An electrical signal representative of this change in capacitance can be generated and transmitted to other portions of a microphone assembly, such as an integrated circuit, for processing, as will be further described.

Unlike other MEMS die structures (e.g., the MEMS die 5 of FIG. 1) in which the electrode (e.g., electrode 10) fully covers a central portion of the back plate and diaphragm, the electrode 122 of the MEMS die 100 of FIG. 2 is positioned away from a central portion 128 of the back plate 104. In particular, the electrode 122 defines an opening 130 that exposes (e.g., uncovers, unmasks, etc.) a central portion 128 of the dielectric layer 120. In the embodiment of FIG. 2, the opening 130 is a generally circular hole that extends through the center of the electrode 122. The opening 130 is aligned with the central axis 116 of the support wall 108 in coaxial arrangement with the aperture 114. In other embodiments, the shape of the opening 130 may be different. For example, the opening 130 may be rectangular, an oval, or any other suitable shape.

Figure 3:
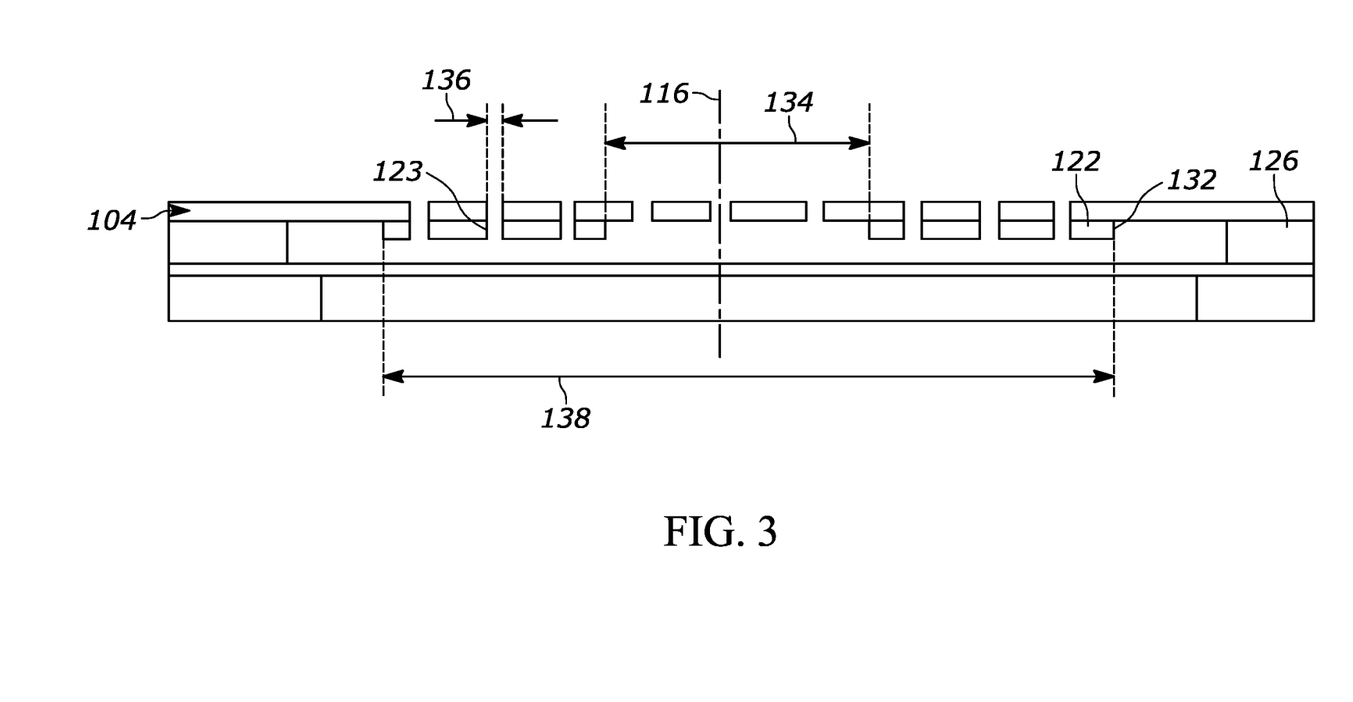
FIG. 3 is a side cross-sectional view of the modified MEMS die of FIG. 2.

As shown in FIG. 2, the electrode 122 of the MEMS die 100 is generally ring shaped (e.g., donut shaped, annular, etc.). As shown in FIG. 3, an outer perimeter 132 of the electrode 122 is spaced apart from the support layer 126 (e.g., substrate) in a radial direction. In other words, the outer perimeter 132 of the electrode 122 is spaced apart from a location at which the back plate 104 is coupled to the support layer 126. As shown in FIG. 3, a diameter 134 of the opening 130 is greater than a diameter 136 of the perforations 123. In one implementation, the diameter 134 of the opening 130 is greater than or equal to ⅒ of the diameter 138 of the electrode 122 (e.g., at least ⅙ of the diameter 138 of the electrode 122, ⅕ of the diameter 138, ¼ of the diameter 138, or greater).

Figure 4:
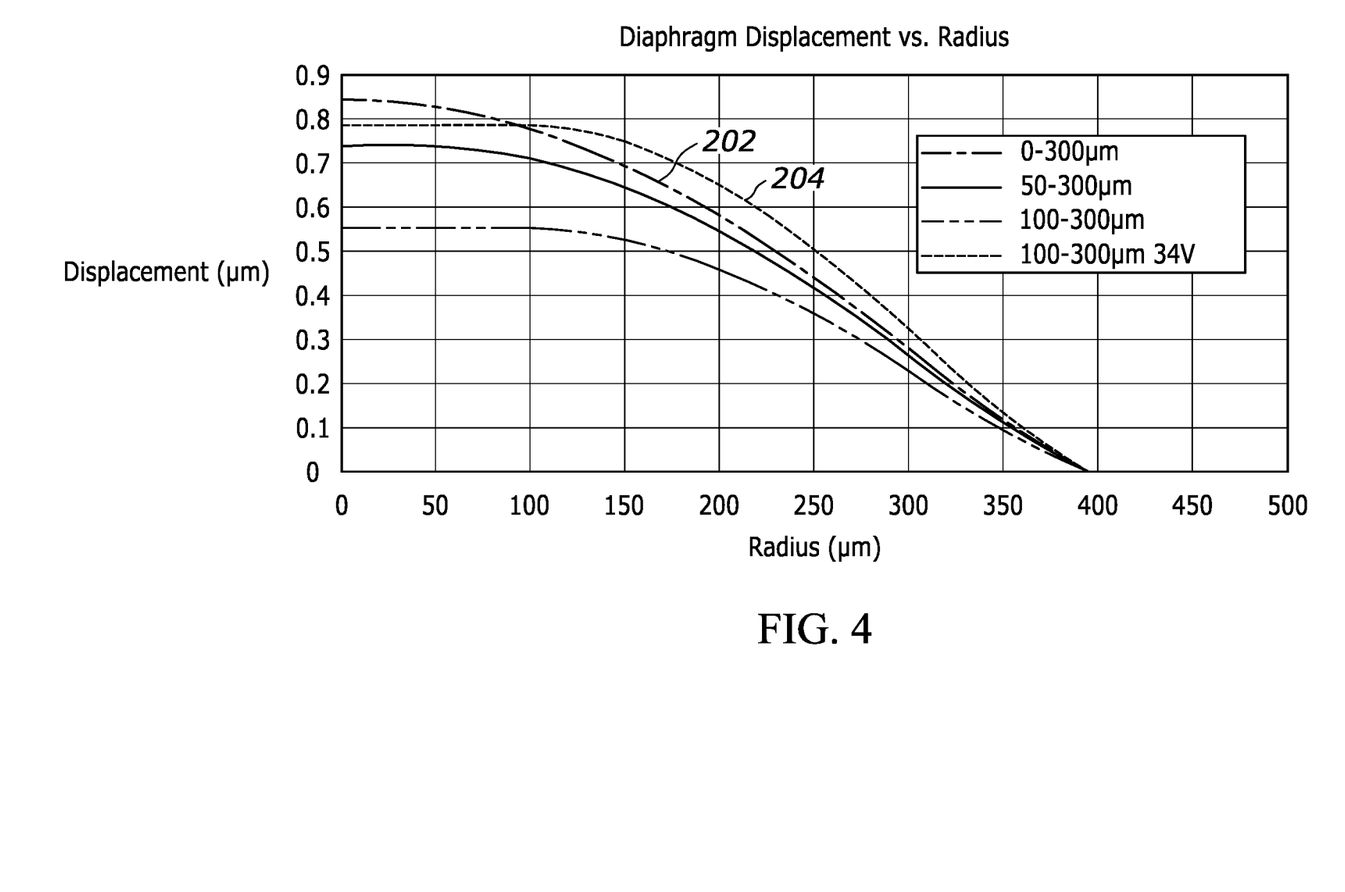
FIG. 4 is a plot showing an amount of diaphragm deflection as a function of the distance from the centerline of the diaphragm for various example MEMS dies.
Figure 5:
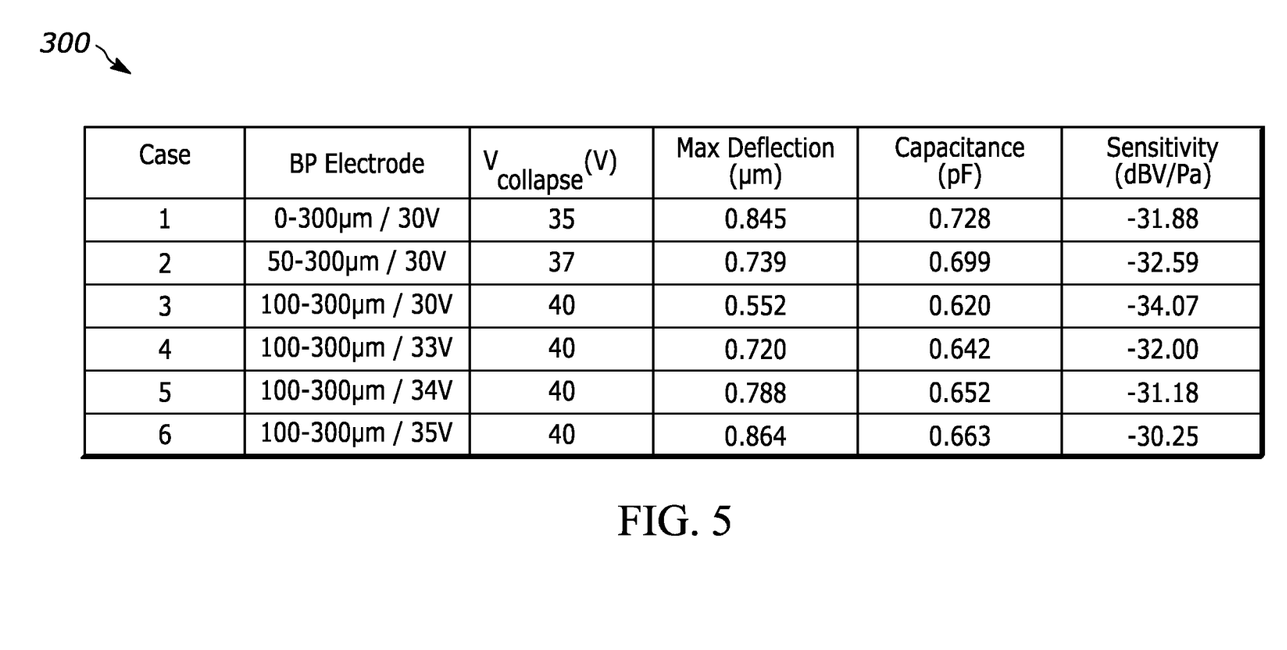
FIG. 5 is a table that compares the performance differences between the example MEMS dies of FIG. 4.

Referring now to FIGS. 4-5, the performance tradeoffs associated with different MEMS dies in accordance with the example embodiments of FIGS. 1-2 is shown. In particular, FIG. 4 shows the diaphragm deflection (e.g., diaphragm displacement in an axial direction) as a function of the radial position along the diaphragm for different MEMS die structures. For example, the solid line 202 corresponds to the anticipated diaphragm deflection for the MEMS die 5 of FIG. 1. As shown in FIG. 4, the electrostatic forces between the electrodes on the diaphragm and the back plate cause an approximately parabolic deflection of the diaphragm. The dashed lines in FIG. 4 correspond to the anticipated diaphragm deflection for the modified MEMS die 100 of FIG. 2, with different lines representing different values of the diameter 134 of the opening 130. As shown in FIG. 4, incorporating the opening 130 into the electrode 122 reduces the maximum amount of deflection of the diaphragm 106 experiences. Reducing the deflection of the diaphragm 106 increases the size of the gap between the back plate 104 and the diaphragm 106, which, advantageously, reduces squeeze film damping and increases the overall SNR.

FIG. 5 shows a table 300 comparing the anticipated performance of different MEMS die structures and, more particularly, MEMS dies having different electrode opening diameters 134. As shown, the modified MEMS die 100 of FIG. 2 (cases 2-6) provides several performance improvements over the MEMS die 5 of FIG. 1 (case 1). For example, comparing cases 1 and 5, the modified MEMS die 100 provides (i) an increase in the acoustic sensitivity; (ii) a lower maximum deflection (i.e., lower squeeze film damping and noise); and (iii) an increased margin of the bias voltage that can be applied between the diaphragm 106 and the back plate 104 before collapse (as compared to the MEMS die 5). For comparison purposes, the deflection of the diaphragm of the modified MEMS die 100 in case 5 is indicated by dashed line 204 in FIG. 4.

The range of electrode opening sizes provided in table 300 of FIG. 5 should not be considered limiting. Many alternatives and combinations are possible without departing from the inventive concepts disclosed herein. For example, it will be appreciated that the diameter 134 of the opening 130 can be adjusted to achieve different performance characteristics in different applications. Additionally, the position of the opening 130 and/or shape of the electrode 122 can also be adjusted depending on how the diaphragm 106 is supported.

Figure 6:
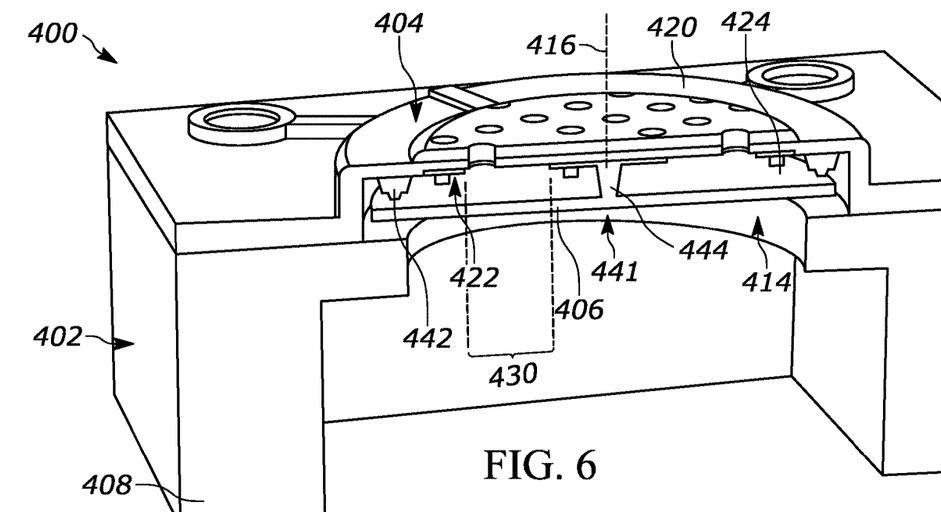
FIG. 6 is a cross-sectional view of another example modified MEMS die.

As shown in FIG. 6, another implementation relates to a MEMS die 400 for a microphone assembly having a diaphragm 406 that is supported at multiple positions along the surface of the diaphragm 406. In particular, the diaphragm 406 is supported near an outer perimeter 440 of the diaphragm 406 and also at a central position 441 over the aperture 414. Other than the different support/boundary conditions for the diaphragm 406 of FIG. 6, the MEMS die 400 may be similar to the modified MEMS die 100 of FIG. 2. For convenience, similar numbering will be used to identify similar components. As shown in FIG. 6, the MEMS die 400 includes a plurality of posts 442 that extend downwardly from the back plate 404 in perpendicular orientation relative to the back plate 404 toward the diaphragm 406 such that the posts 442 contact an upper side 424 of the diaphragm 406. The posts 442 constrain movement of the diaphragm 406 at a periphery of the diaphragm 406. In another embodiment, additional and/or fewer posts 442 may be included. In yet another embodiment, the periphery of the diaphragm 406 may be directly coupled to the substrate 402 (e.g., support wall 408) in at least one location. In yet another embodiment, the MEMS die 400 may employ another type of support structure to suspend the diaphragm 406 between the aperture 414 and the back plate 404.

Figure 7:
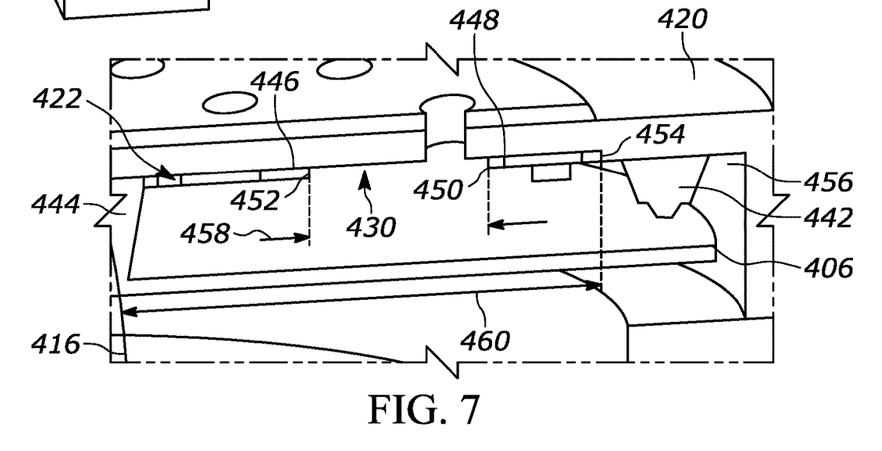
FIG. 7 is a reproduction of a portion of the modified MEMS die of FIG. 6.

As shown in FIGS. 6-7, the MEMS die 400 also includes a central pillar 444 that connects the back plate 404 and the diaphragm 406 at the central position 441. The central pillar 444 extends between the back plate 404 and the diaphragm 406 in a direction that is substantially parallel to a central axis 416 of the substrate 402. In the embodiment of FIG. 6, the pillar 444 is integrally formed with the back plate 404 as a single unitary body. In another embodiment, the pillar 444 is integrally formed with only the diaphragm 406. In yet another embodiment, each of the back plate 404, the diaphragm 406, and the pillar 444 are formed separately from one another. As shown in FIG. 6, the posts 442 and the pillar 444 together may form a clamped boundary condition at both the central position 441 and the outer perimeter 440 of the diaphragm 406. The boundary conditions imposed by the posts 442 and the pillar 444 result in an "M" shaped deflection (e.g., a double curve) of the diaphragm 406 under an applied bias voltage between the back plate 404 and the diaphragm 406.

As shown in FIGS. 6-7, the back plate 404 includes an insulating layer, shown as dielectric layer 420 and a conductive layer, shown as electrode 422 that is deposited onto or otherwise connected to a lower side of the dielectric layer 420 such that the electrode 422 is facing the diaphragm 406. The electrode 422 is formed as two separate cylindrical elements, including an inner cylindrical ring 446 and an outer cylindrical ring 448 that surrounds the inner cylindrical ring 446. The inner cylindrical ring 446 defines a central opening sized to receive the pillar 444 therein such that the inner cylindrical ring 446 completely surrounds the pillar 444. An inner perimeter 450 of the outer cylindrical ring 448 is spaced apart from the outer perimeter 452 of the inner cylindrical ring 446. An outer perimeter 454 of the outer cylindrical ring 448 is spaced apart from an inner perimeter 456 of the substrate 402 (e.g., from the cylindrical wall defining the aperture 414, from a location at which the back plate 404 is supported by the substrate 402, from a location at which the diaphragm 406 is supported by the posts 442, etc.). In other words, the outer diameter of the electrode 422 is less than an outer diameter of the aperture 414, the diaphragm 406, and the back plate 404.

As shown in FIGS. 6-7, the radial spacing between the inner cylindrical ring 446 and the outer cylindrical ring 448 defines an opening 430 that extends through the electrode 422, from a first side of the electrode 422 to a second side of the electrode 422, between the diaphragm 406 and the back plate 404. The opening 430 exposes (e.g., uncovers, unmasks, etc.) a ring shaped portion of the dielectric layer 420 such that the ring shaped portion directly faces the diaphragm 406 through the opening 430. As shown in FIG. 6, each of the inner cylindrical ring 446, the outer cylindrical ring 448, and the opening 430 are aligned with the central axis 116 of the substrate 402 in a substantially coaxial arrangement.

As shown in FIG. 7, a distance 458 between the outer perimeter 452 of the inner cylindrical ring 446 and the inner perimeter 450 of the outer cylindrical ring 448 is greater than or equal to $\frac{1}{10}$ of the overall radius 460 of the outer cylindrical ring 448 (e.g., at least $\frac{1}{6}$ of the overall radius 460 of the outer cylindrical ring 448, $\frac{1}{5}$ of the overall radius 460, $\frac{1}{4}$ of the overall radius 460, or greater). In one implementation, the shape of the inner cylindrical ring 446 and/or the outer cylindrical ring 448 vary in a circumferential direction along the perimeter of the electrode 422. For example, the shape of the electrode 422 (e.g., the radial thickness of and/or radial spacing between the inner cylindrical ring 446 and the outer cylindrical ring 448) may be different when viewed along a cross-section through the posts 442 (as shown in FIG. 6) as compared to a cross-section through a region in between the posts 442.

Figure 8:
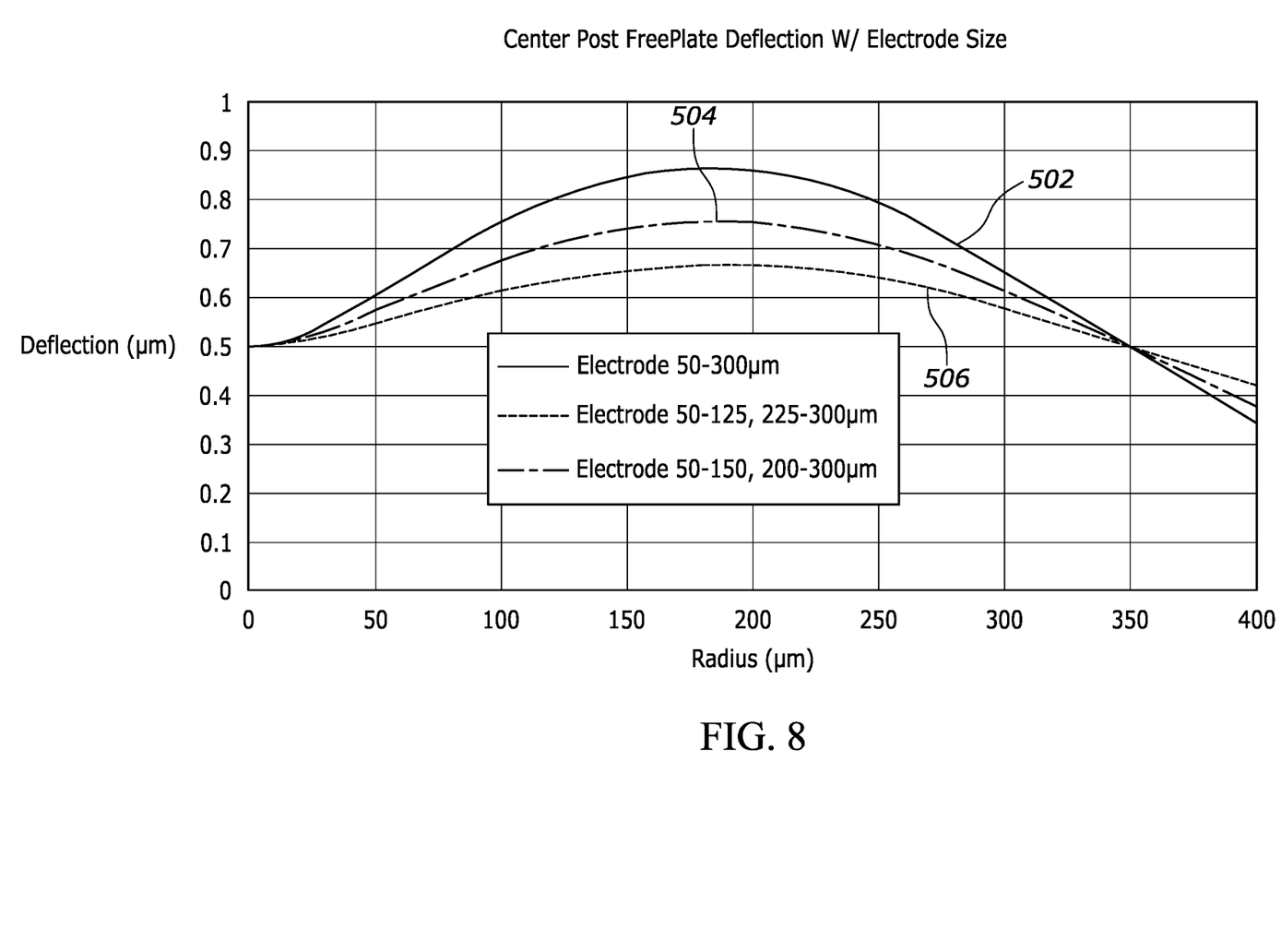
FIG. 8 is a plot showing an amount of diaphragm deflection as a function of a distance from the centerline of the diaphragm for various example MEMS dies.

Referring now to FIG. 8, the performance tradeoffs between the MEMS die 400 of FIGS. 6-7 and a conventional MEMS die (e.g., a MEMS die in which the electrode substantially fully covers a region of the dielectric layer between the posts 442 and the pillar 444) is shown. In particular, FIG. 8 shows the diaphragm deflection (e.g., diaphragm displacement in an axial direction) as a function of the radial position along the diaphragm. The solid line 502 corresponds to the anticipated diaphragm deflection for a conventional MEMS die, while dashed lines 504 and 506 correspond to the anticipated diaphragm deflection for a modified MEMS die similar to that shown in FIGS. 6-7 (e.g., MEMS die 400). Similar to the results outlined in FIG. 4, incorporating the opening 430 into the electrode 422 of the modified MEMS die reduces the maximum amount of deflection of the diaphragm 406. This reduction in diaphragm deflection increases the size of the gap between the back plate 404 and the diaphragm 406, which, advantageously, reduces squeeze film damping and improves the SNR.

The size and positioning of the openings shown in the modified MEMS die of FIG. 2 and FIGS. 6-7 should not be considered limiting. It will be appreciated that a similar design approach can be used to "shape" the electrode for MEMS dies in which the diaphragm is supported differently from that described with reference to FIG. 2 and FIGS. 6-7. In particular, performance improvements may be achieved by positioning the electrode away from a location at which the diaphragm experiences the greatest amount of deflection. For example, the electrode may be selectively positioned away from and/or at least partially surrounding a region of the diaphragm that is farthest from a location at which the diaphragm is supported. In this way, the maximum deflection of the diaphragm can be reduced along with the associated performance penalties.

Figure 9:
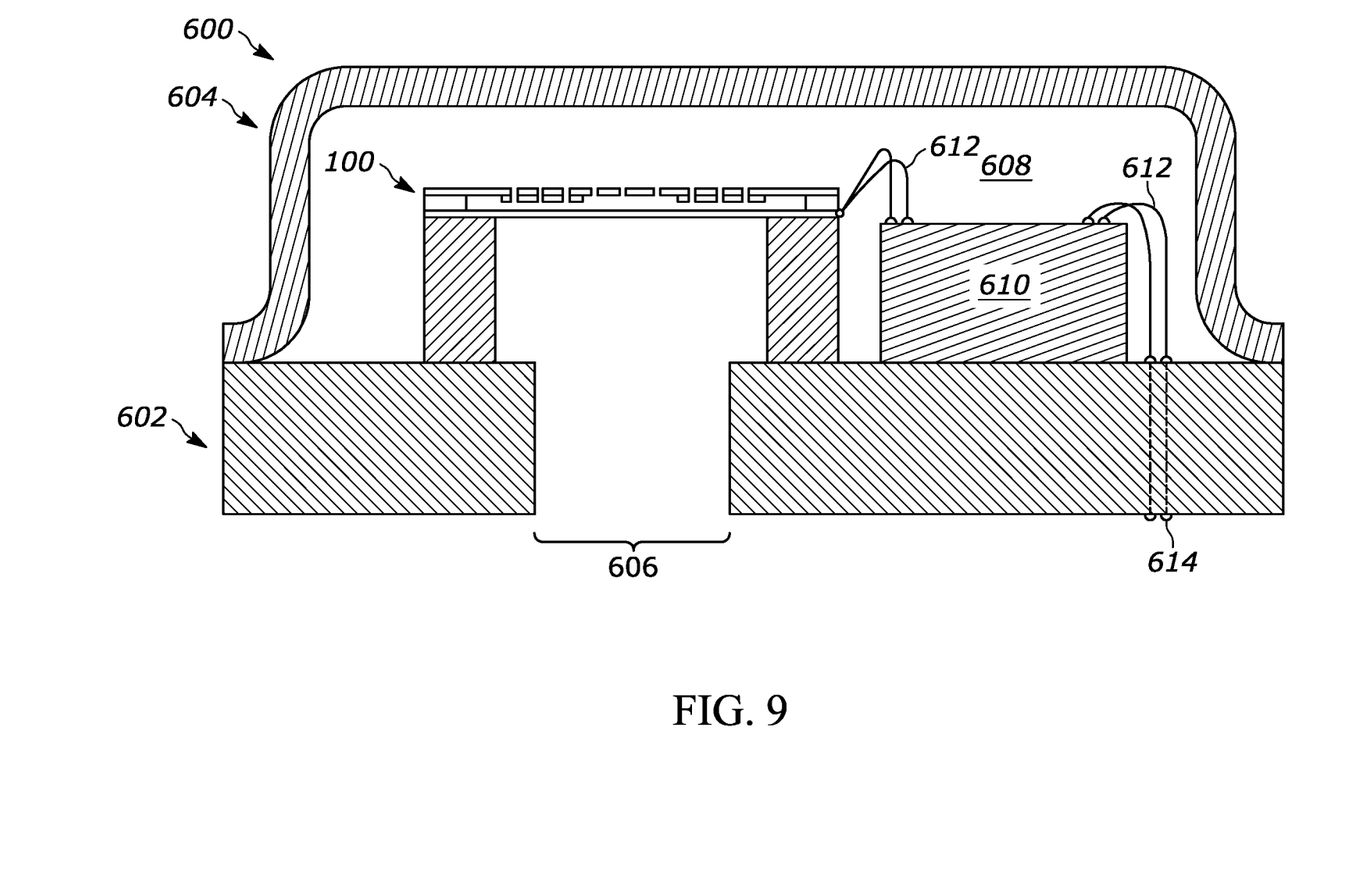
FIG. 9 is a cross-sectional view of an example microphone assembly.

According to an illustrative embodiment, as shown in FIG. 9, the modified MEMS die (e.g., MEMS die 100) is configured to fit within a microphone assembly, shown as assembly 600. As shown in FIG. 9, the assembly 600 includes a housing including a microphone base 602, a cover 604 (e.g., a housing lid), and a sound port 606. In one implementation, the microphone base 602 is a printed circuit board. The cover 604 is coupled to the microphone base 602 (e.g., the cover 604 may be mounted onto a peripheral edge of the microphone base 602). Together, the cover 604 and the microphone base 602 form an enclosed volume 608 for the assembly 600. As shown in FIG. 9, the sound port 606 is disposed on the microphone base 602 and is structured to convey sound waves to the MEMS die 100 located within the enclosed volume 608. In other implementations, the sound port 606 may be disposed on the cover 604 and/or a side wall of the cover 604. In some embodiments, the assembly may form part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

In the embodiment of FIG. 9, the assembly 600 additionally includes an electrical circuit disposed in the enclosed volume 608. The electrical circuit includes an integrated circuit (IC) 610. The IC 610 may be an application specific integrated circuit (ASIC). Alternatively, the IC 610 may include a semiconductor die integrating various analog, analog-to-digital, and/or digital circuits.

In the assembly 600 of FIG. 9, the MEMS die 100 is a MEMS acoustic transducer that converts sound waves, received through sound port 606, into a corresponding electrical microphone signal. The transducer generates an electrical signal (e.g., a voltage) at a transducer output in response to acoustic activity incident on the port 606. As shown in FIG. 9, the transducer output includes a pad or terminal of transducer that is electrically connected to the electrical circuit via one or more bonding wires 612. The assembly 600 of FIG. 9 further includes electrical contacts, shown schematically as contacts 614, typically disposed on a bottom surface of the microphone base 602. The contacts 614 are electrically coupled to the electrical circuit. The contacts 614 are configured to electrically connect the assembly 600 to one of a variety of host devices.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) die, comprising:
   a substrate;
   a back plate coupled to the substrate, the back plate comprising:
      a dielectric layer; and
      an electrode coupled to the dielectric layer, the electrode defining an opening that exposes a central portion of the dielectric layer, wherein an outer perimeter of the electrode is spaced apart from the substrate in a radial direction; and
   a diaphragm oriented parallel to the back plate and spaced apart from the back plate.

2. The MEMS die of claim 1, wherein the diaphragm includes a conductive portion, and wherein the conductive portion is axially aligned with the opening.

3. The MEMS die of claim 1, wherein there is no electrostatic attraction between a central portion of the diaphragm and the back plate in the presence of an applied bias voltage between the back plate and the diaphragm.

4. The MEMS die of claim 1, wherein the electrode is disposed between the diaphragm and the back plate.

5. The MEMS die of claim 1, wherein the electrode is disposed on a side of the back plate opposite the diaphragm.

6. The MEMS die of claim 1, wherein the substrate defines an aperture, and wherein the diaphragm covers the aperture.

7. The MEMS die of claim 1, wherein the electrode is ring shaped.

8. A microphone assembly comprising:
   a microelectromechanical systems (MEMS) die comprising:
      a back plate coupled to a substrate, the back plate comprising a dielectric layer and an electrode coupled to the dielectric layer, the electrode defining an opening that exposes a central portion of the dielectric layer, wherein an outer perimeter of the electrode is spaced apart from the substrate in a radial direction; and
      a diaphragm oriented parallel to the back plate and spaced apart from the back plate;
   a housing, comprising:
      a base,
      a cover coupled to the base, and
      a sound port disposed within one of the base and the cover, wherein the housing defines an enclosed volume, and wherein the MEMS die is coupled to the base and is disposed within the enclosed volume.

9. The microphone assembly of claim 8, wherein the microphone assembly further comprises an integrated circuit coupled to the base and disposed within the enclosed volume, and wherein the integrated circuit is electrically connected to the MEMS die.

10. The microphone assembly of claim 8, wherein the diaphragm includes a conductive portion, and wherein the conductive portion is axially aligned with the opening.

11. The microphone assembly of claim 8, wherein there is no electrostatic attraction between a central portion of the diaphragm and the back plate in the presence of an applied bias voltage between the back plate and the diaphragm.

12. The microphone assembly of claim 8, wherein the electrode is disposed between the diaphragm and the back plate.

13. The microphone assembly of claim 8, wherein the electrode is disposed on a side of the back plate opposite the diaphragm.

14. The microphone assembly of claim 8, wherein the substrate defines an aperture, and wherein the diaphragm covers the aperture.

15. The microphone assembly of claim 8, wherein the electrode is ring shaped.

16. A MEMS die, comprising:
   a substrate;
   a back plate coupled to the substrate, the back plate comprising;
      a dielectric layer; and
      an electrode coupled to the dielectric layer, the electrode defining an opening that exposes a ring shaped portion of the dielectric layer, wherein an outer perimeter of the electrode is spaced apart from the substrate in a radial direction; and
   a diaphragm oriented parallel to the back plate and spaced apart from the back plate.

17. The MEMS die of claim 16, wherein a conductive portion of the diaphragm is axially aligned with the opening.

18. The MEMS die of claim 16, wherein the electrode comprises an inner cylindrical ring and an outer cylindrical ring that surrounds the inner cylindrical ring.

19. The MEMS die of claim 16, further comprising a central pillar that extends between the back plate and the diaphragm and connects the back plate and the diaphragm at a central position along the diaphragm.

20. The MEMS die of claim 16, further comprising a plurality of posts that each extend between the back plate and the diaphragm near an outer perimeter of the diaphragm.

* * * * *